(12) United States Patent
Lee et al.

(10) Patent No.: US 10,146,260 B2
(45) Date of Patent: Dec. 4, 2018

(54) ROLLABLE DISPLAY

(71) Applicant: Samsung Display Co., Ltd., Yongin-si, Gyeonggi-do (KR)

(72) Inventors: Junghun Lee, Hwaseong-si (KR); Younjoon Kim, Seoul (KR); Sangjo Lee, Hwaseong-si (KR); Jusuck Lee, Seoul (KR); Mi Jang, Suwon-si (KR); Kyungmin Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/991,743

(22) Filed: Jan. 8, 2016

(65) Prior Publication Data
US 2016/0202729 A1    Jul. 14, 2016

(30) Foreign Application Priority Data

Jan. 12, 2015 (KR) .................. 10-2015-0003967

(51) Int. Cl.
| | |
|---|---|
| *H05K 5/00* | (2006.01) |
| *H05K 5/02* | (2006.01) |
| *H05K 1/02* | (2006.01) |
| *G06F 1/16* | (2006.01) |

(52) U.S. Cl.
CPC ......... *G06F 1/1652* (2013.01); *H05K 5/0017* (2013.01); *H05K 1/028* (2013.01); *H05K 2201/051* (2013.01)

(58) Field of Classification Search
CPC .... G06F 1/1652; G06F 1/1601; G06F 1/1624; G06F 1/1626; G06F 1/1647; G06F 1/166; G06F 2200/1612; G06F 2203/04102; H05K 1/028; H05K 2201/051; H05K 1/181; H05K 2201/10128; H05K 5/0217; G09F 9/301;
(Continued)

(56) References Cited

U.S. PATENT DOCUMENTS

| | | | | |
|---|---|---|---|---|
| 4,927,365 | A * | 5/1990 | Schauer ................ | B60R 16/027 439/15 |
| 6,038,800 | A * | 3/2000 | Seidel .................... | G09F 11/29 40/514 |

(Continued)

FOREIGN PATENT DOCUMENTS

| | | |
|---|---|---|
| JP | 2000-132122 A | 5/2000 |
| KR | 10-0818170 B1 | 3/2008 |
| KR | 10-2014-0028216 A | 8/2012 |

*Primary Examiner* — James Wu
*Assistant Examiner* — Michael Matey
(74) *Attorney, Agent, or Firm* — Lewis Roca Rothgerber Christie LLP

(57) ABSTRACT

A rollable display is disclosed. In one aspect, the rollable display includes a flexible display panel, a protective film configured to be placed on the flexible display panel, and a first jig connected to a first end of the flexible display panel and a first end of the protective film. The flexible display panel and the protective film are configured to be rolled around the first jig. The rollable display also includes a second jig connected to a second end of the protective film. The protective film is configured to be rolled around the second jig. The rollable display further includes a first housing for the first jig. The first housing is configured to accommodate the flexible display panel and the protective film.

17 Claims, 12 Drawing Sheets

(58) Field of Classification Search
CPC .......... G09F 15/0056; G02F 1/133305; H04M 1/0268
See application file for complete search history.

(56) References Cited

U.S. PATENT DOCUMENTS

| | | | | |
|---|---|---|---|---|
| 6,644,606 B1* | 11/2003 | Seidel | ................ | G09F 7/18 248/220.41 |
| 8,001,711 B2 | 8/2011 | LaFarre et al. | | |
| 8,516,728 B2* | 8/2013 | Jung | ................ | G09F 9/301 160/133 |
| 8,711,566 B2* | 4/2014 | O'Brien | ................ | G06F 1/1624 361/724 |
| 9,877,384 B2* | 1/2018 | Lee | ................ | G06F 1/1652 |
| 2005/0176470 A1* | 8/2005 | Yamakawa | ............ | G09G 3/001 455/566 |
| 2006/0007368 A1* | 1/2006 | Slikkerveer | ............ | G09F 9/35 349/58 |
| 2006/0207142 A1* | 9/2006 | Kochan | ................ | G09F 11/29 40/604 |
| 2007/0241002 A1* | 10/2007 | Wu | ................ | G06F 1/1601 206/150 |
| 2010/0134873 A1* | 6/2010 | van Lieshout | .... | G02F 1/133305 359/296 |
| 2012/0050075 A1* | 3/2012 | Salmon | ................ | G06F 1/1626 341/20 |
| 2012/0204453 A1* | 8/2012 | Jung | ................ | G09F 9/301 40/517 |
| 2012/0231694 A1* | 9/2012 | Hamada | ................ | B65H 75/28 445/24 |
| 2013/0010405 A1* | 1/2013 | Rothkopf | ............ | H04M 1/0216 361/679.01 |
| 2014/0194165 A1* | 7/2014 | Hwang | ................ | G06F 1/1677 455/566 |
| 2015/0029229 A1* | 1/2015 | Voutsas | ................ | G06F 1/1652 345/661 |
| 2015/0268914 A1* | 9/2015 | Kim | ................ | G06F 3/1423 345/1.3 |
| 2015/0340004 A1* | 11/2015 | Pang | ................ | G09G 5/00 345/205 |
| 2016/0054758 A1* | 2/2016 | Han | ................ | G06F 1/1652 361/679.26 |
| 2016/0120022 A1* | 4/2016 | Lee | ................ | G06F 1/1652 361/749 |
| 2016/0139633 A1* | 5/2016 | Lee | ................ | G06F 1/1652 345/33 |
| 2016/0187929 A1* | 6/2016 | Kim | ................ | G06F 1/1652 345/184 |
| 2016/0205791 A1* | 7/2016 | Kim | ................ | G06F 1/1652 361/679.01 |
| 2016/0209879 A1* | 7/2016 | Ryu | ................ | G06F 1/1601 |
| 2016/0239050 A1* | 8/2016 | Kim | ................ | G06F 1/1652 |
| 2016/0239052 A1* | 8/2016 | Kim | ................ | G06F 1/1652 |

* cited by examiner

ROLLABLE DISPLAY

INCORPORATION BY REFERENCE TO ANY PRIORITY APPLICATIONS

This application claims priority to and the benefit of Korean Patent Application No. 10-2015-0003967, filed on Jan. 12, 2015, with the Korean Intellectual Property Office, the disclosure of which is incorporated herein in its entirety by reference.

BACKGROUND

Field

The described technology generally relates to a rollable display.

Description of the Related Technology

Rollable displays are a type of display device which include a flexible display panel that can be rolled to be accommodated within a housing and unrolled to be used as necessary. Due to the increase in portability and the decrease in storage size of rollable displays in contrast to like-sized traditional displays, they are garnering attention as next generation display devices. However, the flexible display panel may be damaged due to friction generated when flexible display panel is rolled or unrolled from the housing.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF CERTAIN INVENTIVE ASPECTS

One inventive aspect is a display device that can prevent its flexible display panel from being damaged due to friction generated when the flexible display panel is rolled or unrolled.

Another aspect is a display device including a flexible display panel; a protective film formed on the flexible display panel; a first jig connected to one end of the flexible display panel and one end of the protective film and on which the flexible display panel and the protective film are rolled therearound; a second jig connected to the other end of the protective film and on which the protective film is rolled therearound; and a first housing accommodating the first jig, the flexible display panel, and the protective film therein.

The display device can further include a first wire connecting the flexible display panel and the protective film to the first jig.

The display device can further include a second wire connecting the protective film to the second jig.

The first wire can have resilience greater than resilience of the second wire.

The first and second wires can be formed of one or more of the following: a leaf spring, a spiral spring, and a coil spring.

The first housing can have a groove accommodating the second jig and the protective film therein.

The display device can further include a second housing accommodating the second jig and the protective film therein.

The second housing can be arranged within the first housing.

The second housing can be arranged on the exterior of the first housing.

The first housing can have a first inlet through which the flexible display panel is drawn in or out.

The second housing can have a second inlet through which the protective film is drawn in or out.

The second inlet can be disposed adjacently to the first inlet.

The second inlet can be connected to an interior of the first housing.

The protective film can be formed of one or more of the following materials: polycarbonate (PC), polyethyleneterephthalate (PET), polypropylene terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and a modified epoxy resin.

The display device can further include a handle connected to the other end of the flexible display panel.

An end portion of the first jig can be rotatably fixed to the first housing.

An end portion of the second jig can be rotatably fixed to the second housing.

Another aspect is a flexible display panel; a protective film configured to be placed on the flexible display panel; a first jig connected to a first end of the flexible display panel and a first end of the protective film, wherein the flexible display panel and the protective film are configured to be rolled around the first jig; a second jig connected to a second end of the protective film, wherein the protective film is configured to be rolled around the second jig; and a first housing for the first jig, wherein the first housing is configured to accommodate the flexible display panel and the protective film.

In exemplary embodiments, the rollable display further comprises a first spring connecting the flexible display panel and the protective film to the first jig. The rollable display can further comprise a second spring connecting the protective film to the second jig. The first spring can have a resilience that is greater than that of the second spring. Each of the first and second springs can comprise one or more of the following: a leaf spring, a spiral spring, and a coil spring. The first housing can have a groove configured to accommodate the second jig and the protective film.

In exemplary embodiments, the rollable display further comprises a second housing configured to accommodate the second jig and the protective film. The second housing can be arranged within the first housing. The second housing can be arranged on an outside surface of the first housing. The first housing can have a first opening through which the flexible display panel is configured to be drawn in or out. The second housing can have a second opening through which the protective film is configured to be drawn in or out.

In exemplary embodiments, the second opening is arranged adjacent to the first opening. The second opening can be connected to an interior of the first housing. The protective film can be formed of one or more of the following materials: polycarbonate (PC), polyethyleneterephthalate (PET), polypropylene terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and a modified epoxy resin.

In exemplary embodiments, the rollable display can further comprise a handle connected to a second end of the flexible display panel. An end portion of the first jig can be rotatably fixed to the first housing. An end portion of the second jig can be rotatably fixed to the second housing.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure will be more clearly understood from the following detailed description taken in conjunction with the accompanying drawings.

DETAILED DESCRIPTION OF CERTAIN INVENTIVE EMBODIMENTS

Figure 1:
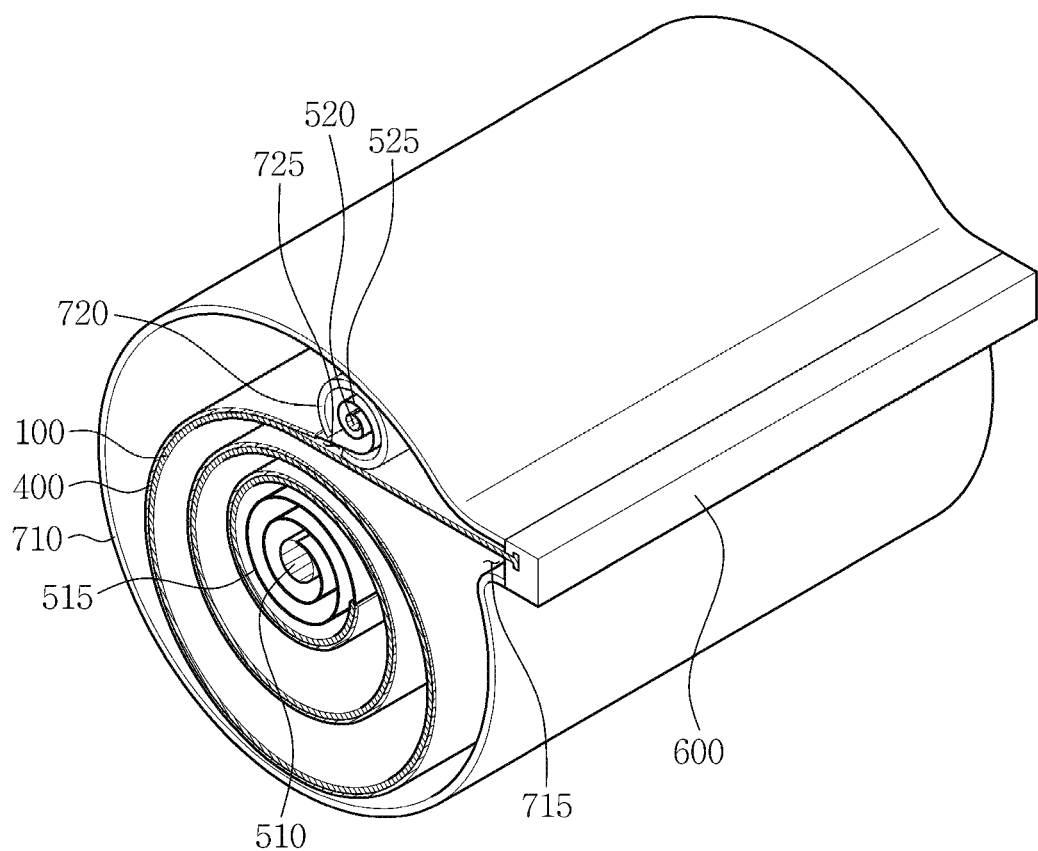
FIG. 1 is a schematic perspective view of a cross-section illustrating a flexible display panel rollably accommodated in a display device according to an exemplary embodiment.

Advantages and features of the described technology and methods for achieving the same will be made clear from embodiments described below in detail with reference to the accompanying drawings. The described technology may, however, be embodied in many different forms and should not be construed as being limited to the embodiments set forth herein. Rather, these embodiments are provided so that this disclosure will be thorough and complete, and will fully convey the scope of the described technology to those skilled in the art. Therefore, well-known constituent elements, operations and techniques are not described in detail in the embodiments in order to prevent the described technology from being obscurely interpreted. Like reference numerals refer to like elements throughout the specification.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", and the like, may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section discussed below could be termed a second element, component, area, layer or section without departing from the teachings of example embodiments.

Unless otherwise defined, all terms used herein (including technical and scientific terms) have the same meaning as commonly understood by those skilled in the art to which the described technology pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
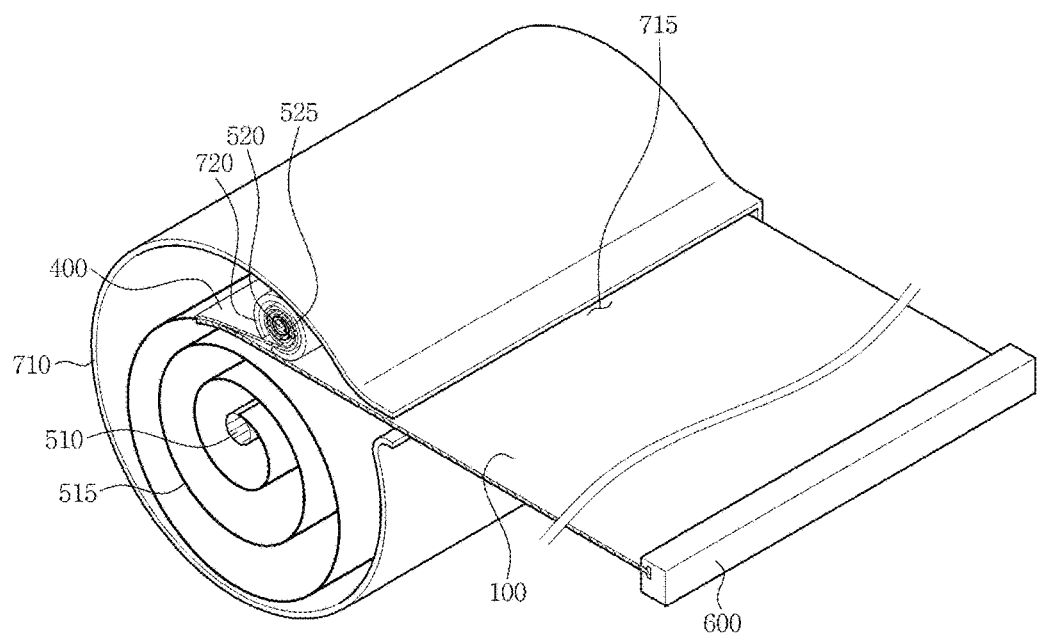
FIG. 2 is a schematic perspective view of a cross-section illustrating a flexible display panel in an unrolled configuration in a display device according to an exemplary embodiment.

FIG. 1 is a schematic perspective view of a cross-section illustrating a flexible display panel rollably accommodated in a display device according to an exemplary embodiment. FIG. 2 is a schematic perspective view of a cross-section illustrating a flexible display panel in an unrolled configuration in a display device according to an exemplary embodiment.

Referring to FIGS. 1 and 2, the display device according to an exemplary embodiment includes a flexible display panel 100, and a protective film 400 formed on the flexible display panel 100. The display device also includes a first jig 510 respectively connected to ends of the flexible display panel 100 and the protective film 400 and having an outer circumferential surface on which the flexible display panel 100 and the protective film 400 can be rolled therearound or unrolled therefrom. The display device further includes a handle 600 connected to the other end of the flexible display panel 100 and a second jig 520 connected to the other end of the protective film 400 and having an outer circumferential surface on which the protective film 400 can be rolled therearound or unrolled therefrom. The display device further includes a first housing 710 accommodating the first jig 510, the flexible display panel 100, and the protective film 400 therein, and a second housing 720 accommodating the second jig 520 and the protective film 400 therein.

The flexible display panel 100 can be rolled around or unrolled from the outer circumferential surface of the first jig 510. The flexible display panel 100 can include an organic light-emitting diode (OLED) display panel formed of a flexible plastic material or a liquid crystal display (LCD) panel. Details pertaining to the configuration of the flexible display panel 100 will be described in greater detail below.

One end of the flexible display panel 100 can be connected to the first jig 510 through a first wire or first spring 515. The flexible display panel 100 and the first wire 515 can be rolled around or unrolled from the first jig 510 in the same direction.

The first wire 515 can provide resilience to enable the flexible display panel 100 in the unrolled configuration to be rolled back around the first jig 510. Alternatively, the first jig 510 can rotate using a motor, or the like, to thereby roll the flexible display panel 100 back around the first jig 510 from the unrolled configuration.

The other end of the flexible display panel 100 can be connected to the handle 600. The handle 600 can provide a tensile force to enable the flexible display panel 100 which is rolled around the first jig 510 to be unrolled therefrom. The handle 600 can be drawn out directly by a user or can be automatically drawn out using a motor, or the like.

The protective film 400 is formed on the flexible display panel 100. The protective film 400 can be formed on at least a surface of the flexible display panel 100.

The protective film 400 can prevent contact between portions of the flexible display panel 100 when the flexible display panel 100 is rolled around or unrolled from the first jig 510.

That is, the protective film 400 can prevent the flexible display panel 100 from being damaged due to friction between the different portions of the flexible display panel 100 when the flexible display panel 100 is rolled around or unrolled from the first jig 510.

In addition, in some embodiments, since the protective film 400 is not directly attached to the flexible display panel 100 despite being formed on the flexible display panel 100, the protective film 400 does not exert a force on a neutral plane NP of the flexible display panel 100.

As used herein, the term neutral plane NP generally refers to a surface of a material having an original length which is maintained without being compressed or tensioned when a bending force is applied thereto. The position of the neutral plane NP can be determined by the thickness, the elastic coefficient, and the like, of each layer forming the flexible display panel 100.

Since the protective film 400 is not directly attached to the flexible display panel 100, the protective film 400 can be separately replaceable.

The protective film 400 can be formed of one or more of the following materials: polycarbonate (PC), polyethyleneterephthalate (PET), polypropylene one terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and a modified epoxy resin. In addition, a commonly used protective film material can be employed herein without limitation.

One end of the protective film 400 can be connected to the first jig 510 through, for example, the first wire 515. The protective film 400 and the first wire 515 can be rolled around or unrolled from the first jig 510 in the same direction.

The first wire 515 can provide resilience so as to enable the protective film 400 in the unrolled configuration to be rolled back around the first jig 510. Alternatively, the first jig 510 can rotate using a motor, or the like, to thereby roll back the protective film 400 around the first jig 510 from the unrolled configuration.

The other end of the protective film 400 can be connected to the second jig 520 through, for example, a second wire or second spring 525. The protective film 400 and the second wire 525 can be rolled around or unrolled from the second jig 520 in the same direction.

The second wire 525 can provide resilience to enable the protective film 400 in the unrolled configuration to be rolled back around the second jig 520. Alternatively, the second jig 520 can rotate using a motor, or the like, to thereby roll back the protective film 400 around the second jig 520 from the unrolled configuration.

The first wire 515 can have a resilience that is greater than that of the second wire 525. The first and second wires 515 and 525 can include at least one of the following: a leaf spring, a spiral spring, a torsion spring, and a coil spring. A description of an operation mechanism pertaining thereto will be described further.

The first housing 710 can accommodate the first jig 510, the flexible display panel 100, and the protective film 400 therein. Although not illustrated, an end portion of the first jig 510 can be rotatably fixed to the first housing 710. In particular, the first housing 710 can have an interior having a cylindrical shape; however, the shape of the first housing 710 is not limited thereto, and the first housing 710 can have various shapes.

In addition, the first housing 710 can have a first inlet or first opening 715 through which the flexible display panel 100 can be drawn in or out. The handle 600 can be stopped by the first inlet 715 of the first housing 710, such that the flexible display panel 100 is prevented from being entirely rolled into the interior of the first housing 710.

The second housing 720 can accommodate the second jig 520 and the protective film 400 therein. Although not illustrated, an end portion of the second jig 520 can be rotatably fixed to the second housing 720. In particular, the second housing 720 can have an interior having a cylindrical shape; however, the shape of the second housing 720 is not limited thereto, and the second housing 720 may have various shapes. In addition, the second housing 720 can have a second inlet or second opening 725 through which the protective film 400 is drawn in or out.

In other words, as the flexible display panel 100 is rollably accommodated in the first housing 710, the protective film 400 can be placed on the flexible display panel 100. Further, as the flexible display panel 100 is unrolled to be drawn out of the first housing 710, the protective film 400 can be separated from the flexible display panel 100.

Although it is illustrated that in the display device according to the exemplary embodiment, the second housing 720 is arranged within the first housing 710, the arrangement of the second housing 720 is not limited thereto, and the second housing 720 can be formed on the exterior of the first housing 710.

Figure 3:
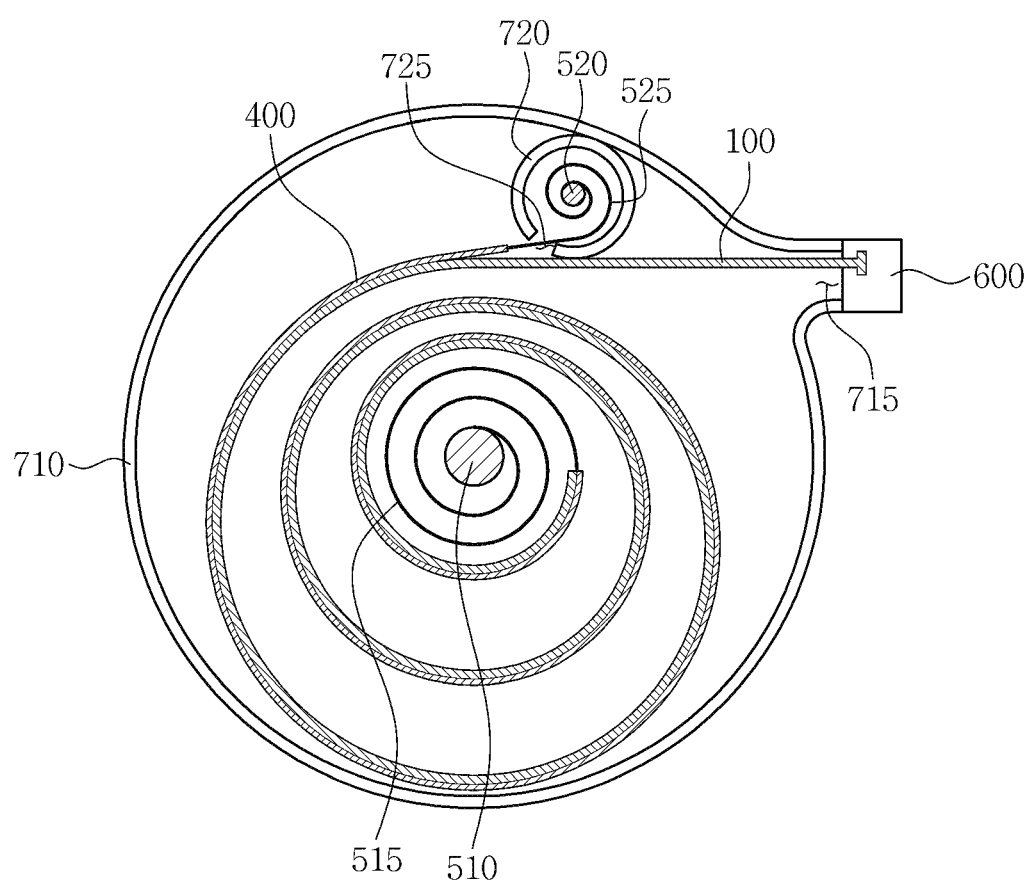
FIGS. 3 through 5 are schematic cross-sectional views illustrating sequential processes of unrolling a flexible display panel in a display device according to an exemplary embodiment.
Figure 4:
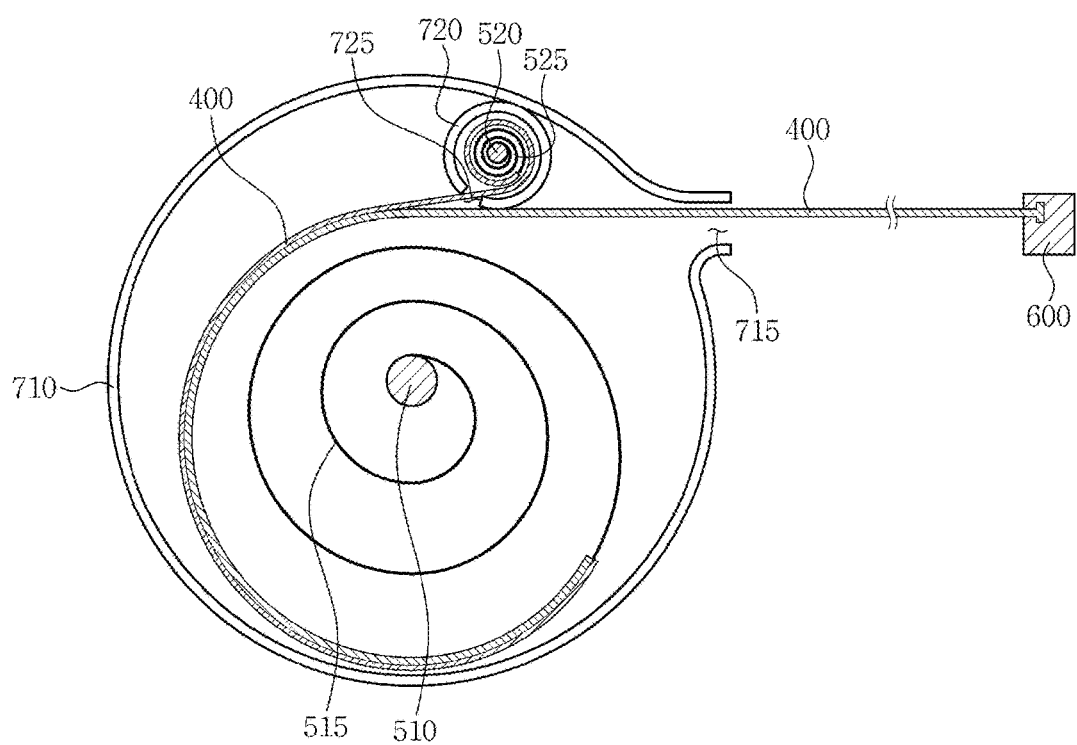
Figure 5:
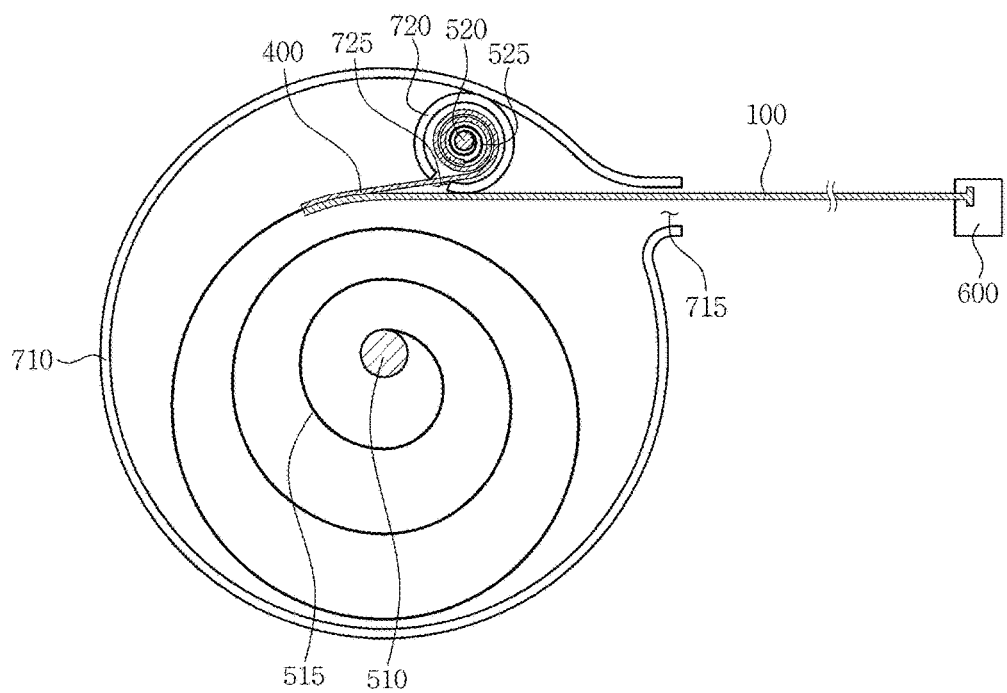

FIGS. 3 through 5 are schematic cross-sectional views illustrating sequential processes of a flexible display panel being unrolled in a display device according to an exemplary embodiment.

FIG. 3 illustrates an example in which the flexible display panel 100 is entirely rolled around the first jig 510. FIG. 4 illustrates an example in which the flexible display panel 100 is in a process of being unrolled from the first jig 510. FIG. 5 illustrates an example in which the flexible display panel 100 is fully unrolled.

Referring to FIGS. 3 through 5, when a user pulls out the handle 600, the flexible display panel 100 can be unrolled from the first jig 510 to thereby be drawn out of the first housing 710 through the first inlet 715. When the flexible display panel 100 is fully unrolled, the first wire 515 can be elongated to a maximum length thereof, thereby storing resilience therein. For example, the elastic potential energy of the first wire 515 can be increased as the flexible display panel 100 is unrolled from the first jig 510.

Additionally, the protective film 400 formed on the display panel 100 can be rolled around the second jig 520 due to resilience of the second wire 525. Here, the protective film 400 can be accommodated in the second housing 720 through the second inlet 725. For example, the energy stored in the second wire 525 can enable the protective film 400 to be rolled about the second jig 520 as the flexible display panel 100 is unrolled from the first jig 510.

Conversely, in a case in which a user pushes in or allows the handle 600 to retract, the flexible display panel 100 can be rolled back around the first jig 510 due to resilience of the first wire 515.

Since the first wire 515 has a resilience that is greater than that of the second wire 525, the protective film 400 can be unrolled from the second jig 520 so as to be rolled back around the first jig 510 along with the flexible display panel 100. When the protective film 400 is entirely rolled around the first jig 510, the second wire 525 can be elongated to a maximum length thereof, thereby storing resilience, or elastic potential energy, therein.

Since the rolling and unrolling of the protective film 400 is performed within the first and second housings 710 and 720, the protective film 400 can be prevented from being visible.

Figure 6:
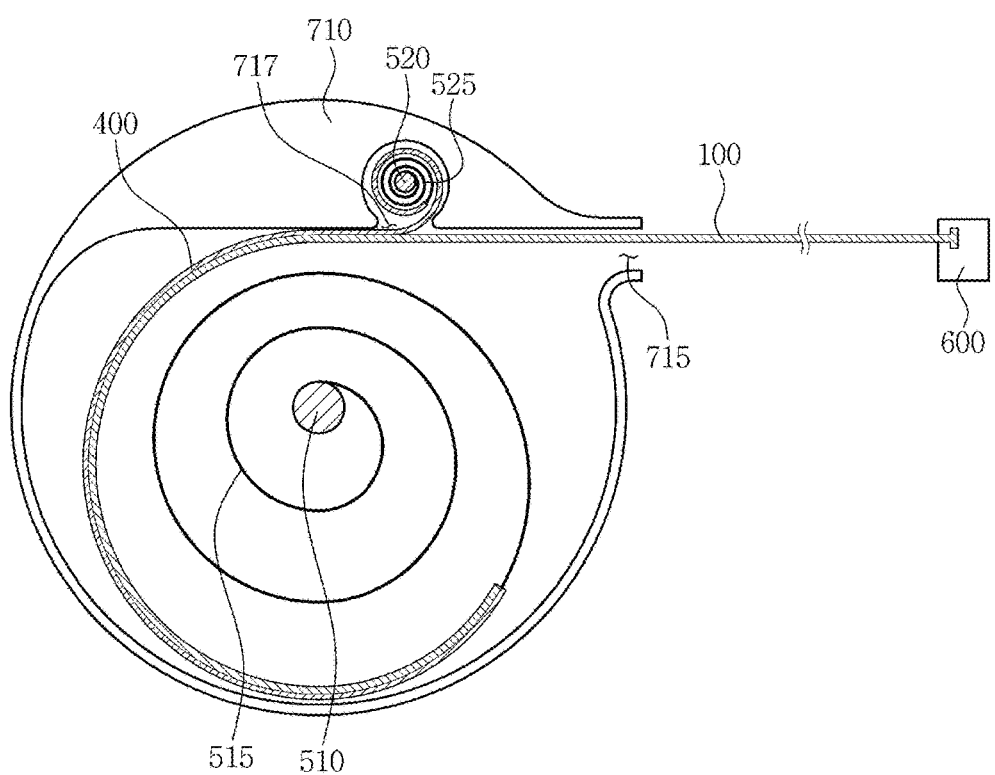
FIGS. 6 through 8 are schematic cross-sectional views illustrating display devices according to other exemplary embodiments.
Figure 7:
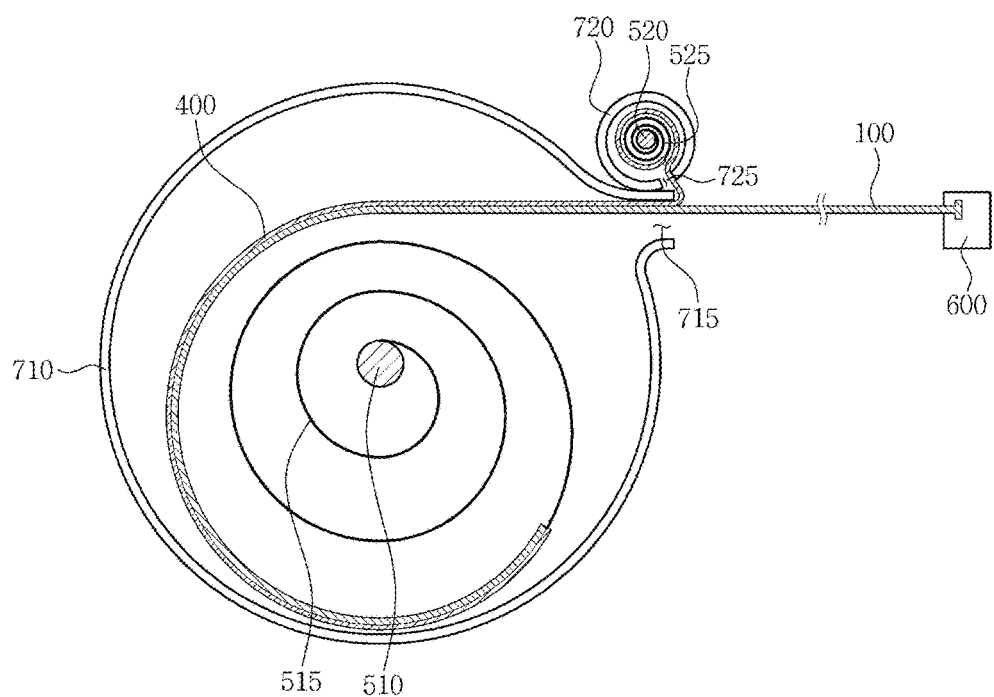
Figure 8:
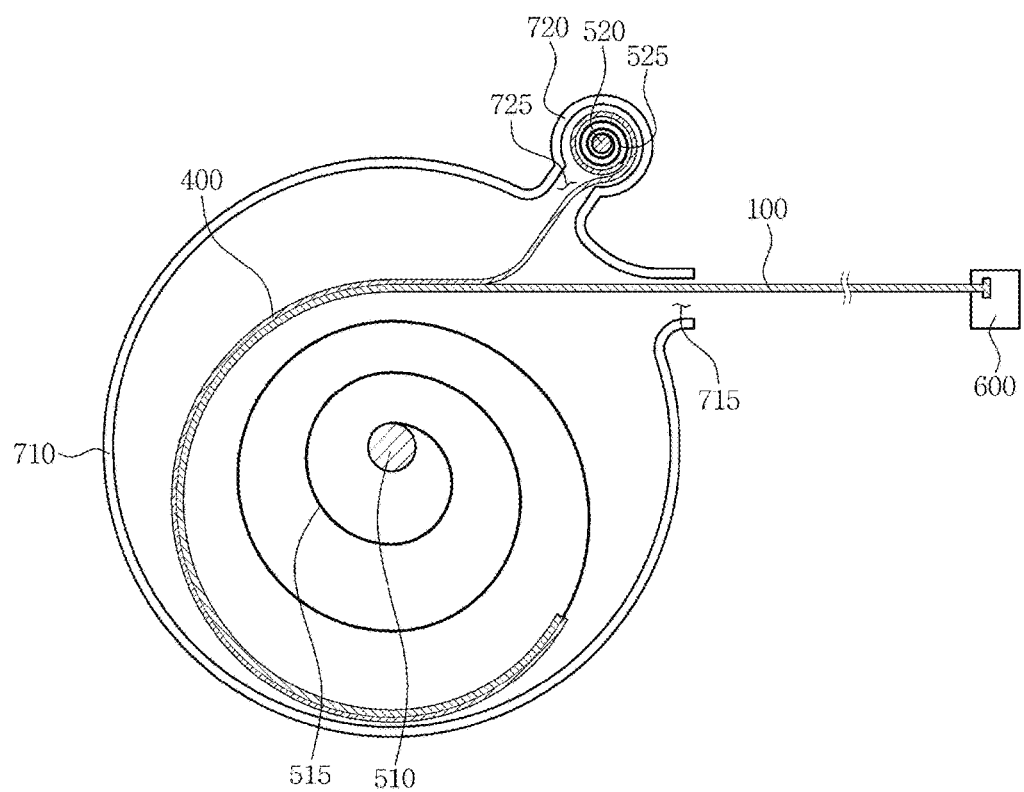

FIGS. 6 through 8 are schematic cross-sectional views illustrating display devices according to other exemplary embodiments. A description of the display devices according to other exemplary embodiments including the same content as that of the display device according to the previously described exemplary embodiment will be omitted for the sake of conciseness.

Referring to FIG. 6, the display device according to another exemplary embodiment includes a flexible display panel 100, a protective film 400 formed on the flexible display panel 100 and a first jig 510 respectively connected to ends of the flexible display panel 100 and the protective film 400 and having an outer circumferential surface on which the flexible display panel 100 and the protective film 400 can be rolled therearound or unrolled therefrom. The display device also includes a handle 600 connected to the other end of the flexible display panel 100, a second jig 520 connected to the other end of the protective film 400 and having an outer circumferential surface on which the protective film 400 can be rolled therearound or unrolled therefrom, and a first housing 710 accommodating the first jig 510, the flexible display panel 100, and the protective film 400 therein.

The first housing 710 can have a first inlet 715 through which the flexible display panel 100 can be drawn in or out. In addition, the first housing 710 can have an accommodating groove 717 which can accommodate the second jig 520 and the protective film 400 rolled around the second jig 520 therein.

Referring to FIGS. 7 and 8, the display device according to another exemplary embodiment includes a flexible display panel 100, a protective film 400 formed on the flexible display panel 100, and a first jig 510 respectively connected to ends of the flexible display panel 100 and the protective film 400 and having an outer circumferential surface on which the flexible display panel 100 and the protective film 400 can be rolled therearound or unrolled therefrom. The display device also includes a handle 600 connected to the other end of the flexible display panel 100, a second jig 520 connected to the other end of the protective film 400 and having an outer circumferential surface on which the protective film 400 can be rolled therearound or unrolled therefrom, a first housing 710 accommodating the first jig 510, the flexible display panel 100, and the protective film 400 therein, and a second housing 720 accommodating the second jig 520 and the protective film 400 therein.

The first housing 710 can have a first inlet 715 through which the flexible display panel 100 can be drawn in or out, and the second housing 720 can have a second inlet 725 through which the protective film 400 can be drawn in or out.

In particular, the second housing 720 can be formed on the exterior of the first housing 710. In this embodiment, the second inlet 725 of the second housing 720 and the first inlet 715 of the first housing 710 can be arranged adjacent to one another as illustrated in FIG. 7.

As a further example, the second inlet 725 can be directly connected to an interior of the first housing 710 as illustrated in FIG. 8.

Figure 9:
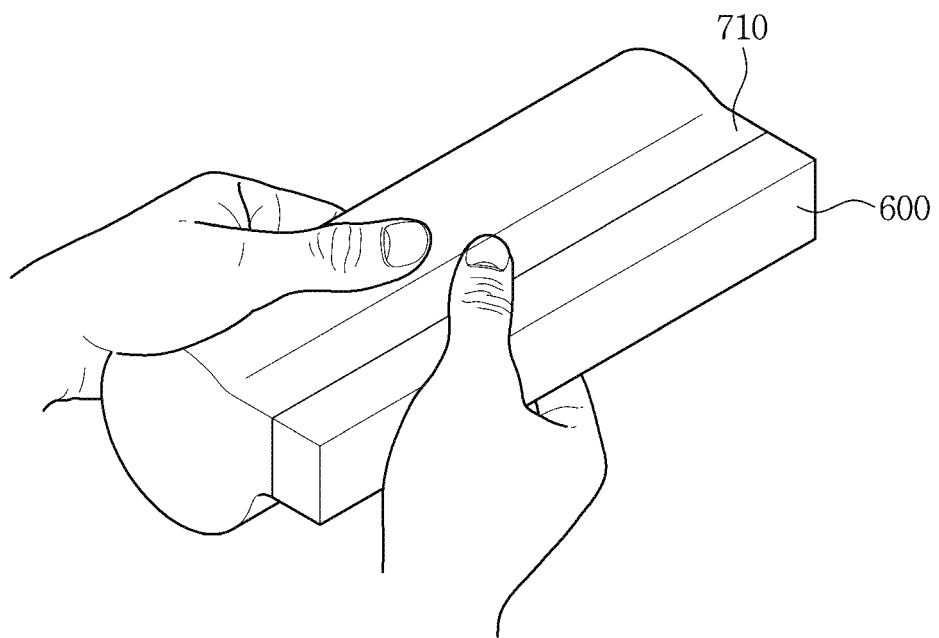
FIGS. 9 and 10 are schematic perspective views illustrating sequential processes of unrolling a flexible display panel in a display device according to an exemplary embodiment.
Figure 10:
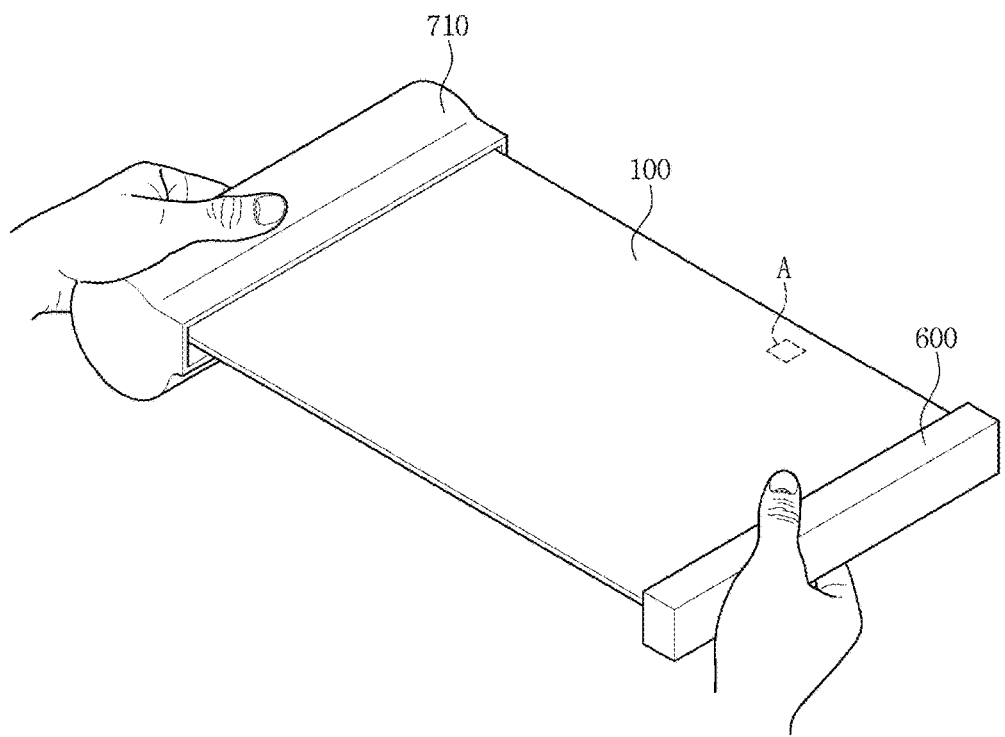
Figure 11:
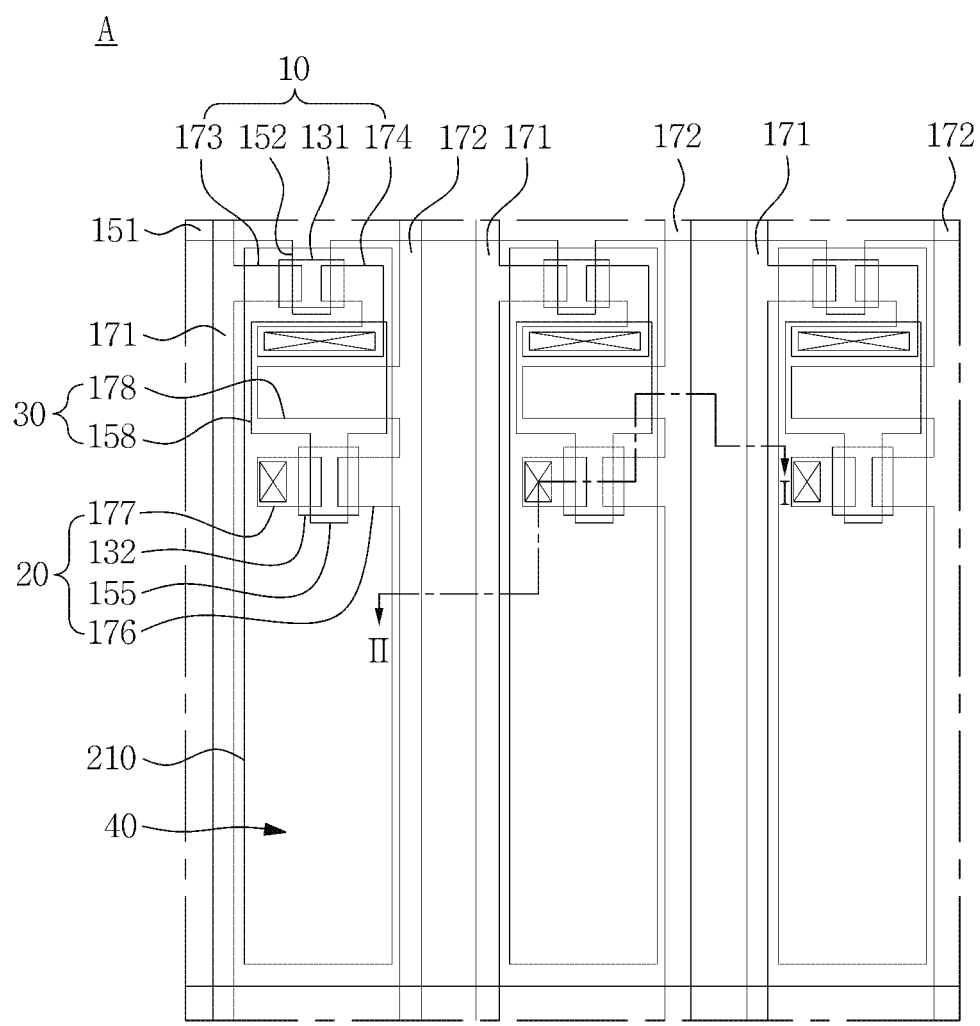
FIG. 11 is an enlarged view illustrating portion "A" of FIG. 10.
Figure 12:
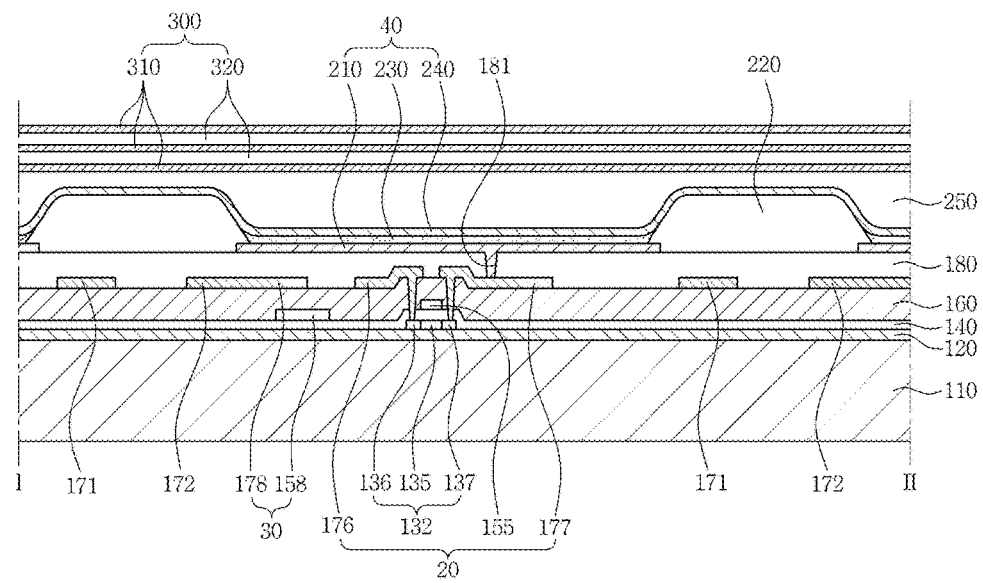
FIG. 12 is a cross-sectional view taken along line I-II of FIG. 11.

FIGS. 9 and 10 are schematic perspective views illustrating sequential processes of unrolling a flexible display panel in a display device according to an exemplary embodiment. FIG. 11 is an enlarged view illustrating portion "A" of FIG. 10. FIG. 12 is a cross-sectional view taken along line I-II of FIG. 11.

Referring to FIGS. 9 through 12, the flexible display panel 100 according to the exemplary embodiment includes a switching thin film transistor (TFT) 10, a driving TFT 20, a power storage element 30, and an OLED 40, which are formed over a flexible substrate 110.

The flexible substrate 110 can be formed of one or more of the following materials: Kapton, polyethersulphone (PES), polycarbonate (PC), polyimide (PI), polyethyleneterephthalate (PET), polyethylenenaphthalate (PEN), polyacrylate (PAR), and fiber reinforced plastic (FRP). In particular, PI, having a high thermal resistivity, may be suitable for forming the flexible substrate 110, which can be subject to high-temperature processes.

The flexible substrate 110 can have a thickness of about 5 micrometers (μm) to about 200 μm. When the flexible substrate 110 has a thickness that is less than about 5 μm, for example, the flexible substrate 110 may not be able to stably support a driving circuit 120 and a display element 130 formed thereon. On the other hand, when the flexible substrate 110 has a thickness that is greater than or equal to about 200 μm, for example, the flexibility thereof may be reduced such that it cannot be easily rolled around the first jig 510. In addition, the flexible substrate 110 can have a coefficient of expansion (CTE) of about 3 parts per million (ppm)/° C. to about 10 ppm/° C.

The flexible substrate 110 can include a buffer layer 120 formed thereon. The buffer layer 120 can prevent the infiltration of impure elements to the flexible substrate 110 and can planarize the surface of the flexible substrate 110. The buffer layer 120 can be formed of various materials that can perform the aforementioned functions. For example, the buffer layer 120 can be formed of one or more of the following materials: silicon nitride ($SiN_x$), silicon oxide ($SiO_2$), and silicon oxynitride ($SiO_xN_y$). The buffer layer 120 is not necessarily required, and thus can be omitted based on the type, the process conditions, and the like, of the flexible substrate 110.

The buffer layer 120 can include a switching semiconductor layer 131 and a driving semiconductor layer 132 formed thereon. The switching semiconductor layer 131 and the driving semiconductor layer 132 can be formed of one or more of the following materials: a polycrystalline silicon layer, an amorphous silicon layer, an oxide semiconductor such as indium-gallium-zinc oxide (IGZO) and indium-zinc-tin oxide (IZTO). For example, when the driving semiconductor layer 132 illustrated in FIG. 12 is formed of a polycrystalline silicon layer, the driving semiconductor layer 132 can include a channel region 135 that is not doped with impurities and source and drain regions 136 and 137 that are respectively doped with p-type materials on both sides of the channel region 135. The ions used for doping can be p-type impurities such as boron (B), and in particular, diborane ($B_2H_6$) can be used. Such impurities can differ based on the type of the TFT. Although a p-type metal-oxide semiconductor (PMOS) TFT using p-type impurities is described as being used as the driving TFT 20 in the exemplary embodiment, the type of the driving TFT 20 is not limited thereto. Accordingly, the driving TFT 20 can also use an n-type metal-oxide semiconductor (NMOS) TFT or a complementary metal-oxide semiconductor (CMOS) TFT.

The switching semiconductor layer 131 and the driving semiconductor layer 132 can include a gate insulating layer 140 formed thereon. The gate insulating layer 140 can be formed of one or more of the following materials: tetraethyl orthosilicate (TEOS), $SiN_x$, and $SiO_2$. For example, the gate insulating layer 140 can have a double-layer structure in which a $SiN_x$ layer having a thickness of about 40 nanometers (nm) and a TEOS layer having a thickness of about 80 nm are sequentially stacked.

The gate insulating layer 140 can include a gate wiring formed thereon, and the gate wiring can include gate electrodes 152 and 155. The gate wiring can further include a gate line 151, a first power storage plate 158, and other wiring(s). The gate electrodes 152 and 155 can be formed to overlap at least portions of the switching and driving semiconductor layers 131 and 132, in particular, the channel region 135. The gate electrodes 152 and 155 can block impurities from being doped in the channel region 135 when the impurities are doped in the source and drain regions 136 and 137 of the switching and driving semiconductor layers 131 and 132 during the formation of the switching and driving semiconductor layers 131 and 132.

The gate electrodes 152 and 155 and the first power storage plate 158 can be formed on the same layer and can be formed of substantially the same metal. The gate electrodes 152 and 155 and the first power storage plate 158 can be formed of one or more of the following materials: molybdenum (Mo), chromium (Cr), and tungsten (W).

The gate insulating layer 140 can include an insulating interlayer 160 covering the gate electrodes 152 and 155. The insulating interlayer 160 can be formed of one or more of the following materials: $SiN_x$, $SiO_x$, TEOS, or the like, in a manner similar to that of the gate insulating layer 140; however, the material forming the insulating interlayer 160 is not limited thereto.

The insulating interlayer 160 can include a data wiring formed thereon, and the data wiring can source electrodes 173 and 176 and drain electrodes 174 and 177. The data wiring can further include a data line 171, a common power line 172, a second power storage plate 178, and other wiring(s). The source electrodes 173 and 176 can be connected to the source regions 136 of the semiconductor layers 131 and 132 and the drain electrodes 174 and 177 can be connected to the drain regions 137 of the semiconductor layers 131 and 132, through contact holes formed in the gate insulating layer 140 and the insulating interlayer 160.

A planarization layer 180 can be formed to cover the data line 171, the common power line 172, the source electrodes 173 and 176, the drain electrodes 174 and 177, and the second power storage plate 178, which are formed over the insulating interlayer 160. The planarization layer 180 can remove any step differences or differences in height between the elements formed over the insulating interlayer 160 and can planarize the elements formed over the insulating interlayer 160 in order to enhance the light emission efficiency of the OLED 40 to be formed over the planarization layer 180. The planarization layer 180 can be formed of one or more of the following materials: a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB).

As such, the switching TFT 10 can include the switching semiconductor layer 131, the gate electrode 152, for example, a switching gate electrode, the source electrode 173, for example, a switching source electrode, and the drain electrode 174, for example, a switching drain electrode. The driving TFT 20 can include the driving semiconductor layer 132, the gate electrode 155, for example, a driving gate electrode, the source electrode 176, for example, a driving source electrode, and the drain electrode 177, for example, a driving drain electrode. The configurations of the switching TFT 10 and the driving TFT 20 is not limited to the aforementioned description, and can be modified in various manners to include the configurations of TFTs known in the art and easily applicable by those skilled in the art. In addition, the power storage element or storage capacitor 30 can include the first power storage plate 158 and the second power storage plate 178 which are formed to have the insulating interlayer 160 interposed therebetween.

The insulating interlayer 160 can be a dielectric material, and capacity of the power storage element 30 can be determined by the amount of electric charges accumulated in the power storage element 30 and the voltage formed between the first and second power storage plates 158 and 178.

The switching TFT 10 can be used as a switching element for selecting a pixel to emit light. The switching gate electrode 152 can be connected to the gate line 151. The switching source electrode 173 can be connected to the date line 171. The switching drain electrode 174 can be spaced apart from the switching source electrode 173 and can be connected to the first power storage plate 158.

The driving TFT 20 can apply a driving power to a pixel electrode 210 of the OLED 40 which drives the OLED 40 within the selected pixel to emit light. The driving gate electrode 155 can be connected to the first power storage plate 158. The driving source electrode 176 and the second power storage plate 178 can be connected to the common power line 172. The driving drain electrode 177 can be connected to the pixel electrode 210 through a contact hole.

Due to the configuration of the TFTs as described above, the switching TFT 10 can be operated by a gate voltage applied to the gate line 151 to thereby transfer a data voltage applied to the data line 171 to the driving TFT 20. A voltage that is substantially equal to the difference between the level of a common voltage applied from the common power line 172 to the driving TFT 20 and the data voltage transferred from the switching TFT 10 can be stored in the power storage element 30. A current based on the voltage stored in the power storage element 30 can flow into the OLED 40 through the driving TFT 20 such that the OLED 40 can emit light.

The OLED 40 can include the pixel electrode 210, a light-emitting layer 230 formed over the pixel electrode 210, and a common electrode 240 formed over the light-emitting layer 230. At least one pixel electrode 210 can be formed in each pixel region.

The pixel electrode 210 of the OLED 40 can be formed over the planarization layer 180. The pixel electrode 210 can be connected to the drain electrode 177 through a contact hole 181 formed in the planarization layer 180.

A pixel defining layer 220 defining the pixel region by exposing at least a portion of the pixel electrode 210 can be formed over the planarization layer 180. The pixel defining layer 220 can be formed of a resin such as a polyacrylate resin or a polyimide resin.

The light-emitting layer 230 can be formed over the pixel electrode 210 within the pixel region, and the common electrode 240 can be formed over the pixel defining layer 220 and the light-emitting layer 230. The light-emitting layer 230 can be formed of a low molecular weight organic material or a polymer organic material. At least one of a hole injection layer (HIL) and a hole transporting layer (HTL) can further be interposed between the pixel electrode 210 and the light-emitting layer 230, and at least one of an electron transporting layer (ETL) and an electron injection layer (EIL) can further be interposed between the light-emitting layer 230 and the common electrode 240.

The pixel electrode 210 and the common electrode 240 can be formed using one of a transmissive electrode, a transflective electrode, and a reflective electrode. The transmissive electrode can be formed of transparent conductive oxide (TCO). Such TCO can be formed of one or more of the following materials: indium-tin oxide (ITO), indium-zinc oxide (IZO), antimony-tin oxide (ATO), aluminum-zinc oxide (AZO), zinc oxide (ZnO), and a compound thereof.

The transflective and reflective electrodes can be formed of a metal such as magnesium (Mg), silver (Ag), gold (Au), calcium (Ca), lithium (Li), Cr, aluminum (Al), or copper (Cu), or an alloy thereof. Here, the type of electrode, for example, the transflective electrode and the reflective electrode, can be determined based on the thickness thereof. In general, the transflective electrode can have a thickness of about 200 nm or less and the reflective electrode can have a thickness of about 300 nm or greater. As the thickness of the transflective electrode decreases, the light transmissivity thereof increases while the resistance thereof increases. Further, as the thickness of the transflective electrode increases, the light transmissivity thereof decreases.

In addition, the transflective and reflective electrodes can have a multilayer structure including a metal layer formed of a metal or a metal alloy and a TCO layer stacked on the metal layer.

A capping layer 250 can be formed over the common electrode 240 in order to protect the OLED 40 prior to forming a thin film encapsulation layer 300 and prevent the OLED 40 from being damaged during the formation of the thin film encapsulation layer 300. The capping layer 250 can be formed of a single layer or two or more layers and can function as a moisture or oxygen barrier. Alternatively, the capping layer 250 can be omitted and an organic layer 320 of the thin film encapsulation layer 300 can be formed in lieu of the capping layer 250.

The thin film encapsulation layer 300 can be formed on the capping layer 250. The thin film encapsulation layer 300 can include at least an inorganic layer 310 and at least an organic layer 320. In addition, the thin film encapsulation layer 300 can have a structure in which the inorganic layer 310 and the organic layer 320 are alternately stacked. In some embodiments, one of the inorganic layers 310 is formed as the lowest layer of the thin film encapsulation layer 300. The thin film encapsulation layer 300 can have a thickness of about 10 μm or less. The number of the inorganic layers 310 and the organic layers 320 is not limited to the example illustrated in FIG. 12.

The inorganic layer 310 can be formed of one or more of the following: aluminum oxide and silicon oxide. The organic layer 320 can be formed of one or more of the following: epoxy, acrylate, and urethane acrylate. The inorganic layer 310 can suppress infiltration of moisture and oxygen toward the flexible display panel 100, and the organic layer 320 can alleviate stress within the inorganic layer 310 and fill minute cracks, pin holes, and the like, formed in the inorganic layer 310.

The thin film encapsulation layer 300 can further include a touch screen panel (not illustrated) provided thereon. The touch screen panel can detect the presence and position of a touch input. For example, a user can the touch screen panel via a stylus pen, their finger, or the like. The touch screen panel can be formed of a transparent material.

As set forth above, according to at least one exemplary embodiment, the display device can prevent the flexible display panel from being damaged due to friction between overlapping portions of the flexible display when it is rolled or unrolled by placing the protective film on the flexible display panel.

In addition, in the display device, due to the protective film not being directly attached to the flexible display panel, the protective film does not exert any force on the neutral plane of the flexible display the protective film can be separately replaceable.

Further, the display device can enable the protective film to be accommodated using an additional component, for example, the second housing, when the flexible display panel being unrolled, such that the protective film is not visible.

From the foregoing, it will be appreciated that various embodiments in accordance with the inventive technology have been described herein for purposes of illustration, and that various modifications may be made therein without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the inventive technology.

What is claimed is:

1. A rollable display, comprising:
a flexible display panel;
a protective film configured to be placed on the flexible display panel;
a first jig connected to a first end of the flexible display panel and a first end of the protective film, wherein the flexible display panel and the protective film are configured to be rolled around the first jig;
a second jig connected to a second end of the protective film, wherein the protective film is configured to be rolled around the second jig;
a first housing for the first jig, wherein the first housing is configured to accommodate the flexible display panel and the protective film; and
a first spring directly contacting the first end of the flexible display panel and the first jig,
wherein the first spring is disposed between the first jig and the flexible display panel.

2. The rollable display of claim 1, further comprising a second spring connecting the second end of the protective film to the second jig.

3. The rollable display of claim 2, wherein each of the first and second springs comprises one or more of the following: a leaf spring, a spiral spring, and a coil spring.

4. The rollable display of claim 1, wherein the first housing has a groove configured to accommodate the second jig and the protective film.

5. The rollable display of claim 1, wherein the protective film is formed of one or more of the following materials: polycarbonate (PC), polyethyleneterephthalate (PET), polypropylene terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and a modified epoxy resin.

6. The rollable display of claim 1, further comprising a handle connected to a second end of the flexible display panel.

7. The rollable display of claim 1, wherein an end portion of the first jig is rotatably fixed to the first housing.

8. A rollable display, comprising:
a flexible display panel;
a protective film configured to be placed on the flexible display panel;
a first jig connected to a first end of the flexible display panel and a first end of the protective film, wherein the flexible display panel and the protective film are configured to be rolled around the first jig;
a first spring directly contacting the first end of the flexible display panel and the first jig;
a second jig connected to a second end of the protective film, wherein the protective film is configured to be rolled around the second jig;
a second spring connecting the protective film to the second jig; and
a first housing for the first jig, wherein the first housing is configured to accommodate the flexible display panel and the protective film,
wherein the first spring has a resilience that is greater than that of the second spring,
wherein the first spring is disposed between the first jig and the flexible display panel.

9. A rollable display, comprising:
a flexible display panel;
a protective film configured to be placed on the flexible display panel;
a first jig connected to a first end of the flexible display panel and a first end of the protective film, wherein the flexible display panel and the protective film are configured to be rolled around the first jig;
a second jig connected to a second end of the protective film, wherein the protective film is configured to be rolled around the second jig;
a first spring directly contacting the first end of the flexible display panel and the first jig;
a first housing for the first jig, wherein the first housing is configured to accommodate the flexible display panel and the protective film; and
a second housing configured to accommodate the second jig and the protective film,
wherein the first spring is disposed between the first jig and the flexible display panel.

10. The rollable display of claim 9, wherein the second housing is arranged within the first housing.

11. The rollable display of claim 9, wherein the second housing is arranged on an outside surface of the first housing.

12. The rollable display of claim 11, wherein the first housing has a first opening through which the flexible display panel is configured to be drawn in or out.

13. The rollable display of claim 12, wherein the second housing has a second opening through which the protective film is configured to be drawn in or out.

14. The rollable display of claim 13, wherein the second opening is arranged adjacent to the first opening.

15. The rollable display of claim 13, wherein the second opening is connected to an interior of the first housing.

16. The rollable display of claim 9, wherein an end portion of the second jig is rotatably fixed to the second housing.

17. The rollable display of claim 9, wherein the first and second housing are configured to accommodate the entire protective film and prevent the protective film from being visible.

* * * * *